United States Patent
Ker et al.

(10) Patent No.: US 6,690,067 B2
(45) Date of Patent: Feb. 10, 2004

(54) ESD PROTECTION CIRCUIT SUSTAINING HIGH ESD STRESS

(75) Inventors: Ming-Dou Ker, Hsinchu (TW); Che-Hao Chuang, Hsinchu (TW); Hsin-Chin Jiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/330,137

(22) Filed: Dec. 30, 2002

(65) Prior Publication Data

US 2003/0197246 A1 Oct. 23, 2003

(30) Foreign Application Priority Data

Apr. 22, 2002 (TW) .......................... 091108195

(51) Int. Cl.$^7$ ............................................. H01L 23/62
(52) U.S. Cl. .................. 257/355; 257/173; 257/213; 257/360
(58) Field of Search ................ 257/173, 355, 257/390, 401, 565, 354, 213, 360

(56) References Cited

U.S. PATENT DOCUMENTS

| | | | | | |
|---|---|---|---|---|---|
| 5,811,856 A | * | 9/1998 | Lee | ............................. | 257/355 |
| 5,852,541 A | * | 12/1998 | Lin et al. | ..................... | 361/111 |
| 5,949,634 A | * | 9/1999 | Yu | ............................. | 361/111 |
| 5,982,217 A | * | 11/1999 | Chen et al. | ................... | 327/321 |
| 6,072,219 A | * | 6/2000 | Ker et al. | ..................... | 257/355 |
| 6,140,687 A | * | 10/2000 | Shimomura et al. | ........ | 257/401 |
| 6,249,410 B1 | * | 6/2001 | Ker et al. | ...................... | 361/56 |
| 6,399,990 B1 | * | 6/2002 | Brennan et al. | ............ | 257/355 |
| 6,465,768 B1 | * | 10/2002 | Ker et al. | ................. | 250/214.1 |
| 6,465,848 B2 | * | 10/2002 | Ker et al. | ..................... | 257/355 |
| 2002/0153570 A1 | * | 10/2002 | Lin et al. | ..................... | 257/355 |
| 2002/0163009 A1 | * | 11/2002 | Ker et al. | ..................... | 257/107 |

* cited by examiner

*Primary Examiner*—Amir Zarabian
*Assistant Examiner*—Monica Lewis
(74) *Attorney, Agent, or Firm*—Birch, Stewart, Kolasch & Birch, LLP

(57) ABSTRACT

A substrate-triggered ESD protection component having dummy gate structures. The ESD protection component includes a bipolar junction transistor (BJT), a substrate-triggering region to provide triggering current and a dummy gate structure. The BJT comprises a collector. The dummy gate structure has a poly-silicon gate adjacent to the collector and the substrate-triggering region. The emitter of the BJT is coupled to a power line, the collector is coupled to a pad, and the substrate-triggering region is coupled to an ESD detection circuit. During normal circuit operations, a base of the BJT is coupled with the power line through the ESD detection circuit to keep the BJT off. When an ESD event occurs between the pad and the power line, a triggering current is provided to the substrate-triggering region by the ESD detection circuit to trigger on the BJT and release ESD current.

17 Claims, 9 Drawing Sheets

ESD PROTECTION CIRCUIT SUSTAINING HIGH ESD STRESS

This nonprovisional application claims priority under 35 U.S.C. §119(a) on patent application Ser. No. 09/1108,195 filed in TAIWAN, R.O.C. on Apr. 22, 2002, which is herein incorporated by reference.

BACKGROUND OF THE INVENTION

1. Field of the Invention

The present invention relates in general to an electrostatic discharge (ESD) protection component, and more particularly to an ESD protection component using dummy gate structures to isolate substrate-triggering regions.

2. Description of the Related Art

As manufacturing processes progress, highly integrated designs such as miniaturized components, shallower junction depths, thinner gate oxide layers, lightly-doped drain (LDD) structures and salicide process have made integrated circuits (ICs) more vulnerable to ESD damage. ESD protection circuits or ESD protection components are frequently built into chips to prevent such damage.

N-type metal-oxide-semiconductors (NMOSs) with finger-type structure are usually used as ESD protection components to release transient current during an ESD event. However, ESD robustness may not be improved as the size of the NMOSs become larger, due to lack of turn-on uniformity.

The turn-on uniformity of the finger-type NMOSs can be enhanced with gate-driven or substrate-triggered techniques as shown in FIGS. 1a and 1b. With a gate-driven technique, gate-oxide layers at gates of MOSs are easily damaged when the gates are overstressed and large ESD current flows through the surface channel under the gates. ESD robustness of the gate-driven MOSs is decreased when the gate voltage is somewhat increased. With a substrate-triggered technique, on the other hand, ESD robustness increases with growing bias current at a substrate. Substrate-triggered techniques are thus more suitable for solving ESD problems in ICs.

Substrate-triggered techniques have been disclosed in U.S. Pat. Nos. 5,744,842 and 6,072,219 in FIGS. 2, 3a and 3b. In both cases, field oxide layers are used to isolate substrate triggering doped regions and doped regions used as drains/sources of a metal-oxide-semiconductor field-effect-transistor (MOSFET). Field oxide layers can be formed by local oxidation (LOCOS) or shallow trench isolation (STI).

SUMMARY OF THE INVENTION

The present invention is directed to a substrate-triggered ESD protection component having high triggering speed, and its application in a circuit.

The present is further directed to a substrate-triggered ESD protection component having smaller size, and its application in a circuit.

Accordingly, the present invention provides a substrate-triggered ESD protection component having dummy gate structures. The ESD protection component comprises a bipolar junction transistor (BJT), a substrate-triggering region to provide triggering current and a dummy gate structure. The BJT comprises a collector. The dummy gate structure has a poly-silicon gate adjacent to the collector and the substrate-triggering region. An emitter of the BJT is coupled to a power line, the collector is coupled to a pad, and the substrate-triggering region is coupled to an ESD detection circuit. During normal circuit operations, a base of the BJT is coupled with the power line through the ESD detection circuit. When an ESD event occurs between the pad and the power line, a triggering current is provided to the substrate-triggering region by the ESD detection circuit to trigger the BJT and release ESD current.

The BJT can be a lateral BJT parasitic under a gate structure of a MOSFET. The MOSFET can be a single MOSFET or a stacked MOSFET.

The present invention further provides an ESD protection circuit, comprising an ESD detection circuit, and the substrate-triggered ESD protection component having the dummy gate structures described. During normal circuit operations, the base is coupled to the power line. When an ESD event occurs between the pad and power line, the substrate-triggering current is provided by the ESD detection circuit to trigger the BJT and release ESD current.

The present invention further provides more structures implementing the substrate-triggering ESD protection component of the present invention, including finger-type MOSFET and polygon MOSFET structures.

According to an ESD protection component of the present invention, a substrate-triggering region is closer to a base of a parasitic BJT in an ESD protection component. The ESD protection component is triggered much faster during an ESD event, resulting in better ESD robustness.

BRIEF DESCRIPTION OF THE DRAWINGS

For a better understanding of the present invention, reference is made to a detailed description to be read in conjunction with the accompanying drawings, in which:

FIG. 4b is a circuit implemented by the NMOS in FIG. 4a.

DETAILED DESCRIPTION OF THE INVENTION

The present invention utilizes a dummy gate to isolate a substrate-triggering region from drain/source regions of a MOSFET and hence optimize ESD robustness.

Figure 1A:
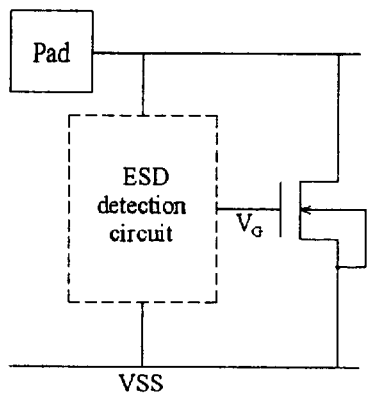
FIGS. 1a and 1b are schematic diagrams respectively showing an ESD gate-driven technique and a substrate-triggered technique.
Figure 1B:
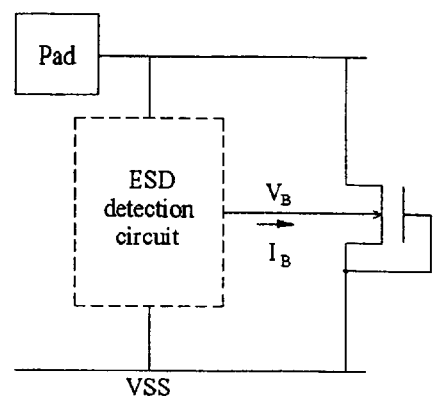
Figure 2:
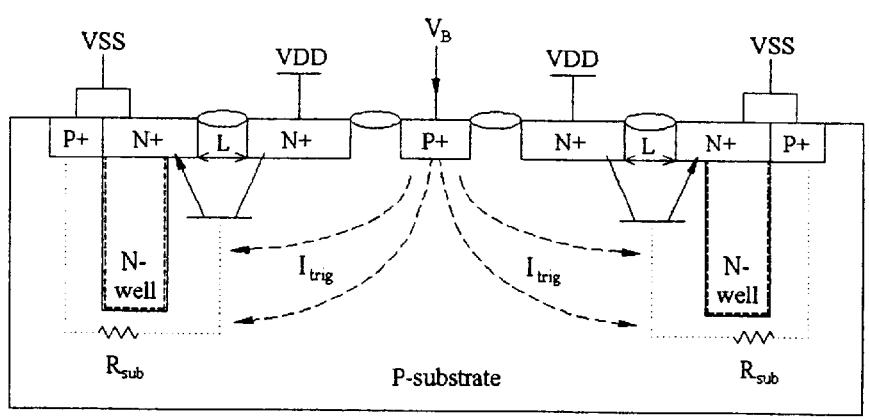
FIGS. 2, 3a and 3b show embodiments of substrate-triggered techniques.
Figure 3A:
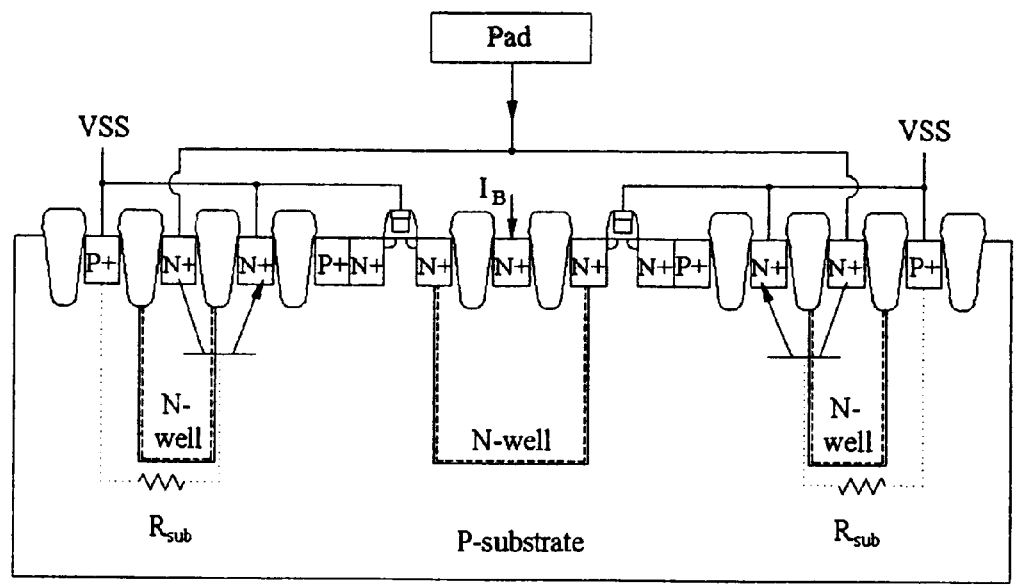
Figure 3B:
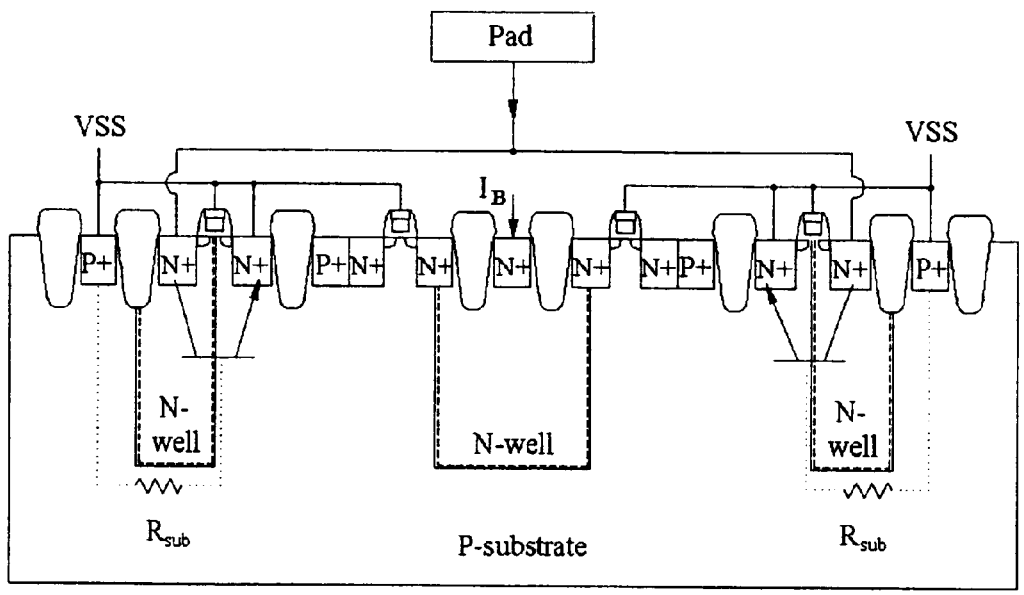
Figure 4A:
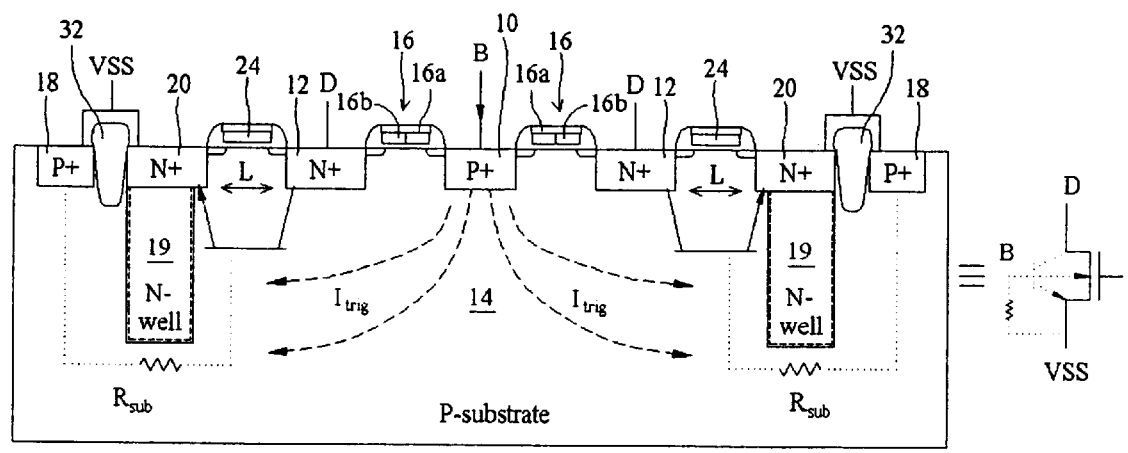
FIG. 4a shows a cross section and the corresponding symbol of an NMOS fabricated in accordance with the present invention as an ESD protection component.
Figure 4B:
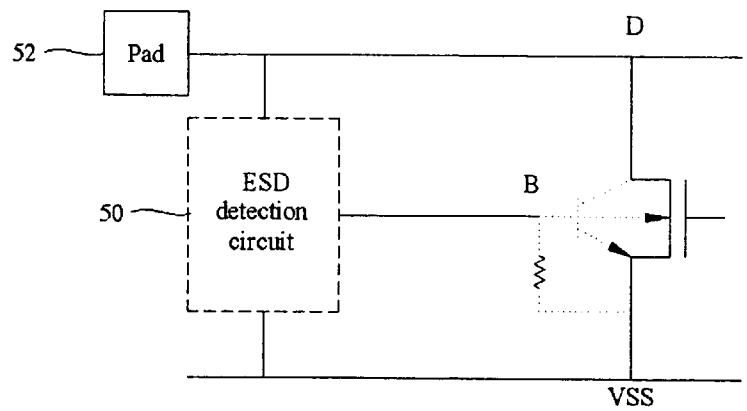

A cross section of an NMOS fabricated in accordance with the present invention as an ESD protection component is shown in FIG. 4a. A circuit implemented by the NMOS in FIG. 4a is shown in FIG. 4b. In FIG. 4a, a P+ doped region 10 used as a substrate-triggering region to provide triggering current is encased in a drain region 12 of the NMOS. The P+ doped region 10 is isolated from the drain region 12 by a dummy gate structure 16. During a P+ ion implantation, the P+ doped region 10 and a region 16a of the dummy gate structure 16 adjacent to the P+ doped region 10 are simultaneously doped with positive-type ions. During an N+ ion implantation, the drain region 12 and a region 16b of the dummy gate structure 16 adjacent to the drain region 12 are simultaneously doped with negative-type ions.

As shown in FIG. 4b, the substrate-triggering region 10 is coupled to an ESD detection circuit 50. Embodiments of the ESD detection circuit 50 are disclosed in prior art such as U.S. Pat. Nos. 5,744,842 and 6,072,219. The drain region 12 of the NMOS is coupled to a pad 52 or a high power line VDD. A source region 20 of the NMOS is coupled to a low power line VSS. A P+ doped region 18 grounds a P-substrate 14 and is used as a guard ring of the NMOS for preventing latch-up. The P-substrate 14 can be a P-well formed on a P-substrate. A lateral NPN bipolar junction transistor (BJT) formed by the drain region 12, the P-substrate 14 and the source region 20 is parasitic under a poly-silicon gate 24, as shown in FIG. 4a.

During normal circuit operations, a base of the NPN BJT is coupled to the low power line VSS via a spread resistance $R_{sub}$ in the P-substrate 14 and the P+ doped region 18. The NPN BJT is closed, leaving the NMOS to be controlled by a gate voltage. When positive pulses of an ESD occurs at the drain region 12 of the NMOS, triggering current $I_{trig}$ is provided by the ESD detection circuit 50 to the P+ doped region 10. As the triggering current $I_{trig}$ flows toward the low power line VSS, the voltage at the base of the NPN BJT increases. The parasitic NPN BJT is then triggered, releasing large ESD current.

In FIG. 4a, an N-well 19 formed under the source region 20 is an option to increase the spread resistance $R_{sub}$ between the base of the BJT and the P+ doped region 18, and to enhance the triggering speed of the ESD protection component.

Figure 5:
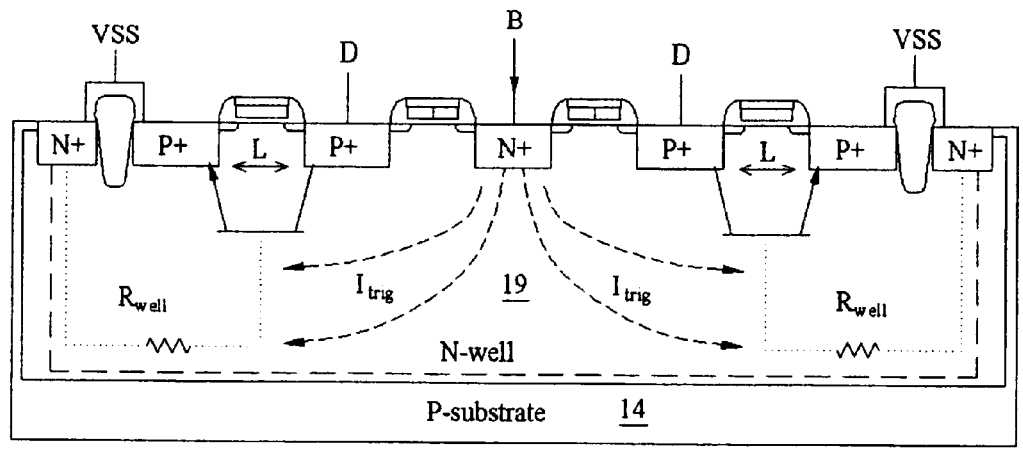
FIG. 5 is a cross section of a PMOS fabricated in accordance with the present invention as an ESD protection component.

In addition to a NMOS, the concept of the present invention can also be applied to a PMOS used as an ESD protection component, as shown in FIG. 5. An N-well 19 is formed on a P-substrate 14 to become a bulk of the PMOS. The transition of the ESD protection component from the NMOS in FIG. 4 to the PMOS in FIG. 5 can be easily comprehended by those skilled in the art and is not described herein.

The width of a poly-silicon gate can be narrower than that of a field oxide layer. Using the dummy gate structure 16 to isolate the substrate-triggering region from the source/drain region of the MOSFET, the distance between the substrate-triggering region and the base of the parasitic BJT is shortened. In short, when a dummy gate structure is used, the triggering current $I_{trig}$ reaches the base of the BJT more quickly in an ESD event such that the triggering speed and ESD robustness of the ESD protection component are improved.

Figure 6:
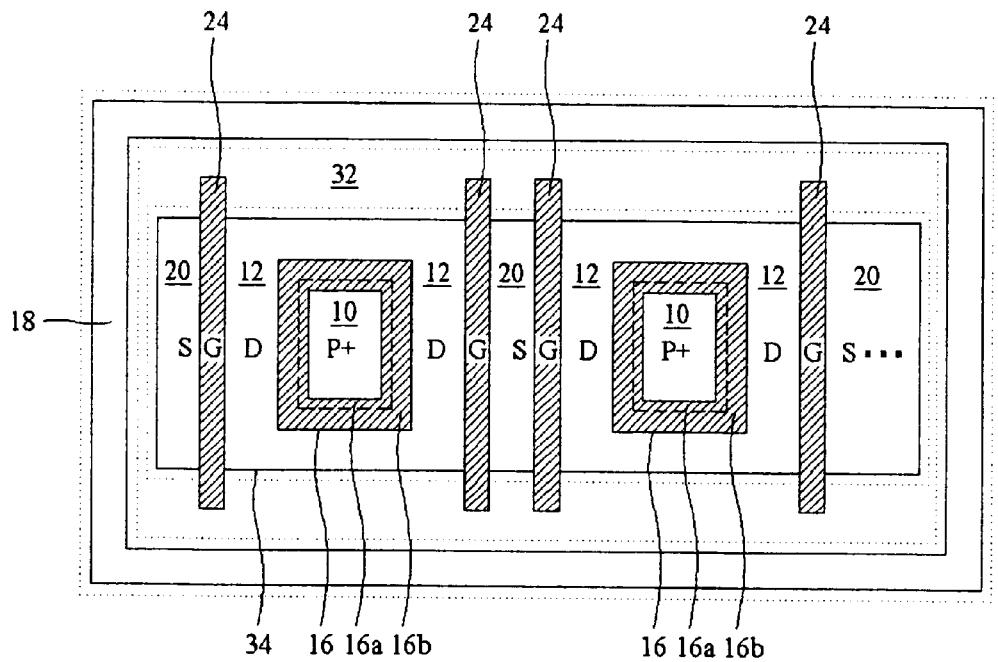
FIG. 6 is the top view of a layout of an NMOS structure of the present invention.

FIG. 6 is the top view of a NMOS structure fabricated in accordance with the present invention. The NMOS structure is surrounded by a guard ring 18 that is isolated from an active area 34 by a field oxide layer 32. The NMOS structure in FIG. 6 is a finger-type NMOS structure having a plurality of gate structures 24 formed approximately in parallel. N+ drain regions 12 and N+ source regions 20 are alternately formed between the gate structures 24. Dummy gate structures 16 are formed in the drain regions 12. P+ doped regions 10 surrounded by the dummy gate structures 16 are used as substrate-triggering regions providing triggering current. Regions 16b of the dummy gate structures 16 are doped with negative-type ions and regions 16a of the dummy gate structures 16 are doped with positive-type ions. The dummy gate structures 16 are formed in accordance with a minimum rule to shorten the distance between the doped regions 10 and bases of the parasitic NPN BJTs. The formation of a PMOS structure using dummy gate structures is similar to that of the NMOS structure in FIG. 6. Therefore, relevant descriptions are omitted herein.

Figure 7:
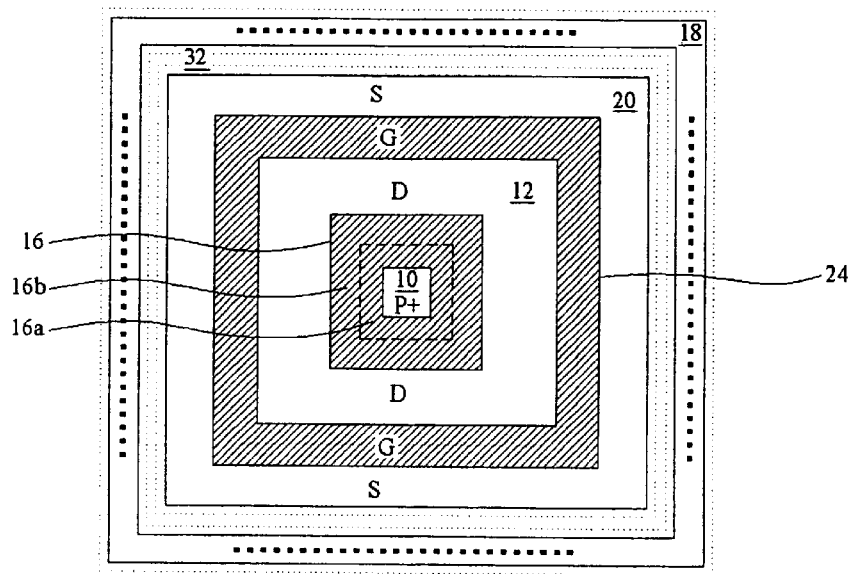
FIGS. 7 and 12 show two tetragon NMOS cells fabricated in accordance with the present invention as ESD protection components.

An ESD protection component of the present invention can be fabricated into an n-sided polygon for having a minimum layout area and good turn-on uniformity. A tetragon (n=4) ESD protection component is used as an example as follows. A tetragon NMOS cell used as an ESD protection component in accordance with the present invention is shown in FIG. 7. A P+ doped region 10 used as a substrate-triggering region to provide triggering current is surrounded by a dummy gate structure 16 isolating the P+ doped region 10 from a drain region 12 of the NMOS cell. A region 16b of the dummy gate structure 16 is doped with negative-type ions. A region 16a of the dummy gate structure 16 is doped with positive-type ions. A channel region and the drain region 12 are defined by a tetragon gate structure 24 surrounded by a source region 20 of the NMOS cell. The formation of the NMOS cell is completed with a guard ring 18 bordering the source region 20. A plurality of the NMOS cells may be coupled in parallel to create a larger channel width and optimize driving ability and ESD robustness. Similarly, PMOS cells having dummy gate structures and used as an ESD protection component can be fabricated by those skilled in the art without the addition of further descriptions.

Figure 8:
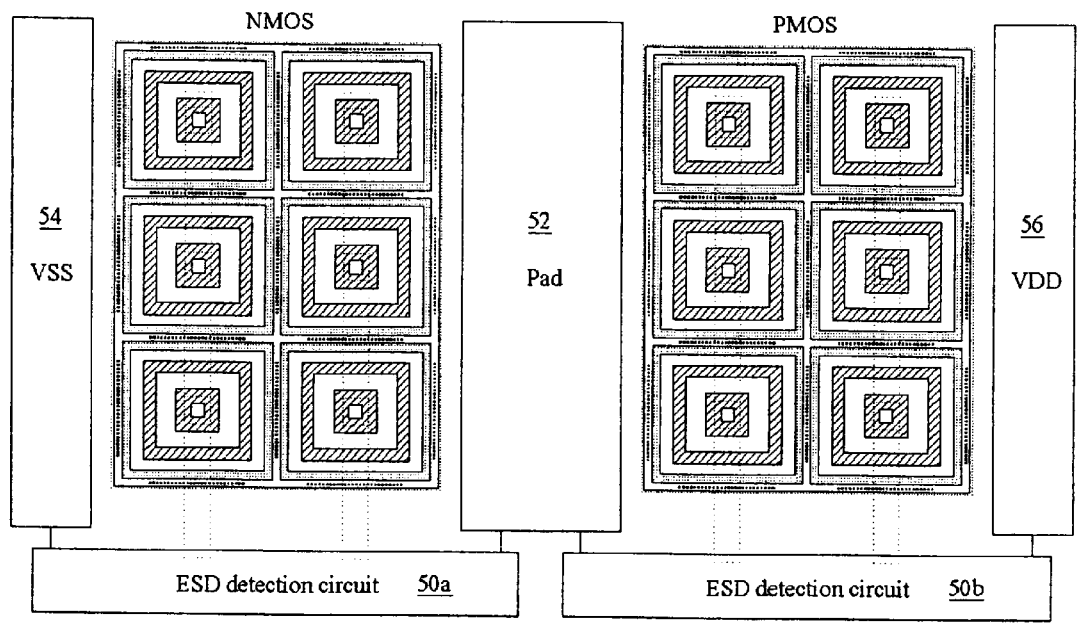
FIGS. 8 and 13 show embodiments of the tetragon NMOS or PMOS cells of the present invention used at an I/O pad of ESD protection circuits.

The tetragon NMOS or PMOS cells can be used at an input/output (I/O) pad of an ESD protection circuit or an ESD clamping circuit between power lines. An embodiment of the tetragon NMOS and PMOS cells used at an I/O pad of an ESD protection circuit is shown in FIG. 8. Six NMOS cells are formed into a matrix between a pad 52 and a VSS power line 54. Sources and drains of the NMOS cells are coupled in parallel. Gates of the NMOS cells may be coupled to a pre-driver (not shown) or the VSS power line 54 in accordance with the required driving ability. Substrate triggering regions for generating triggering current of the NMOS cells are coupled to an ESD detection circuit 50a through contacts or metal strips. When an ESD event is detected between the pad 52 and the VSS power line 54, triggering current is provided to all the NMOS cells by the ESD detection circuit 50a and the parasitic BJTs under the NMOS cells are triggered on. The number of the NMOS cells is not limited to six and can vary accordingly. During normal circuit operations, no current is provided by the ESD detection circuit 50a so that the parasitic BJTs are closed. Layout and operations of PMOS cells of the present invention coupled between the pad 52 and a VDD power line 56 are similar to those of the NMOS cells. Relevant descriptions can thus be omitted.

Figure 9:
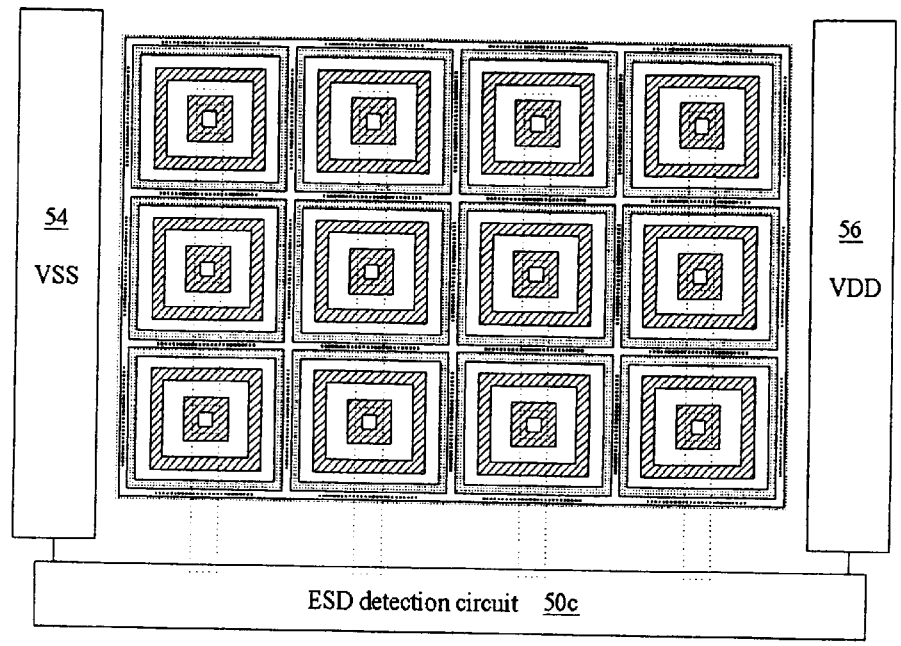
FIGS. 9 and 14 show embodiments of the tetragon NMOS or PMOS cells of the present invention used in ESD clamping circuits.

An embodiment of the tetragon PMOS or NMOS cells of the present invention used in an ESD clamping circuit between power lines is described in FIG. 9. A plurality of the NMOS or PMOS cells of the present invention configured into a matrix are coupled between a VDD power line 56 and a VSS power line 54. Substrate-triggering regions used to provide triggering current are coupled to an ESD detection circuit 50c. When an ESD event is detected between the VDD power line 56 and the VSS power line 54 by the ESD detection circuit 50c, triggering current is provided by the ESD detection circuit 50c to the substrate-triggering regions, and parasitic BJTs in the MOS cells are evenly triggered on. During normal circuit operations, on the other hand, no current is provided by the ESD detection circuit 50c. Therefore, no parasitic BJTs are triggered and the NMOS or PMOS cells are closed.

ESD protection components implemented by the concept of the present invention can also be used in a stacked MOSFET. In contrast to a single MOSFET having only one gate structure for controlling a circuit, a plurality of gate structures are formed in a stacked MOSFET with every two gate structures sharing a drain/source region. The stacked MOSFETs are formed by MOSFETs connected in series.

Figure 10A:
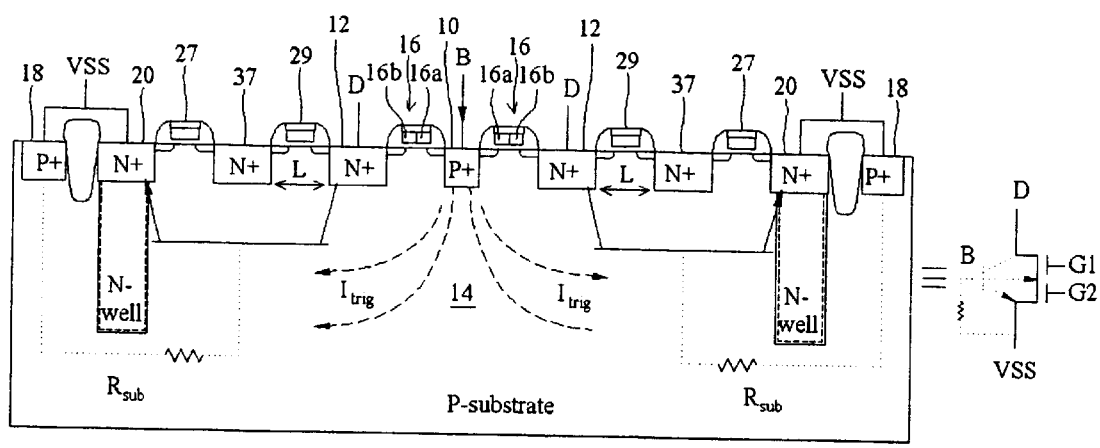
FIG. 10a is a cross section and a corresponding symbol of stacked NMOSs of the present invention.
Figure 10B:
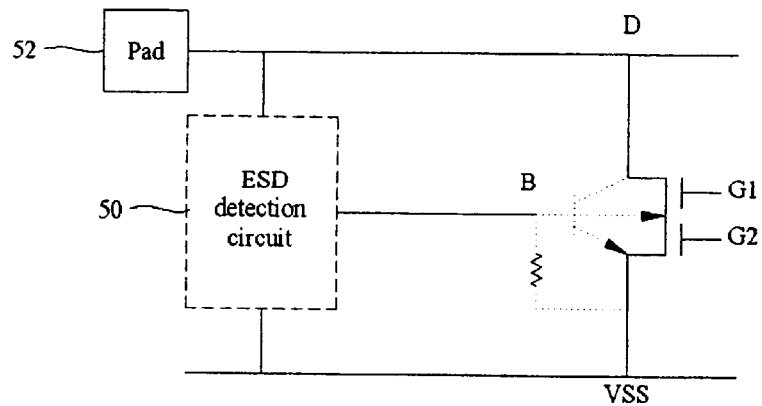
FIG. 10b shows a circuit implemented by the stacked NMOSs of the present invention.

FIG. 10a is a cross section and a corresponding symbol of the stacked NMOS fabricated in accordance with the present invention. A circuit implemented by the stacked NMOS in FIG. 10a is shown in FIG. 10b. Gate structures 27 and 29 are formed between a N+ source region 20 and a N+ drain region 12. A shared N+ doped region 37 is formed between the two gate structures 27 and 29. A P+ doped region 10 used as a substrate-triggering region to provide triggering current is formed in the drain region 12. A dummy gate structure 16 is formed to isolate the P+ doped region 10 from the drain region 12. During a p+ ion implantation, a region 16a of the dummy gate 16 close to the P+ doped region 10 is doped with positive-type ions. During an N+ ion implantation, a region 16b of the dummy gate 16 close to the drain region 12 is simultaneously doped with negative-type ions. The operation of the stacked NMOS in FIGS. 10a and 10b is similar to the single NMOS illustrated in FIGS. 4a and 4b during an ESD event and under normal circuit operations and thus is not illustrated further more.

Figure 11:
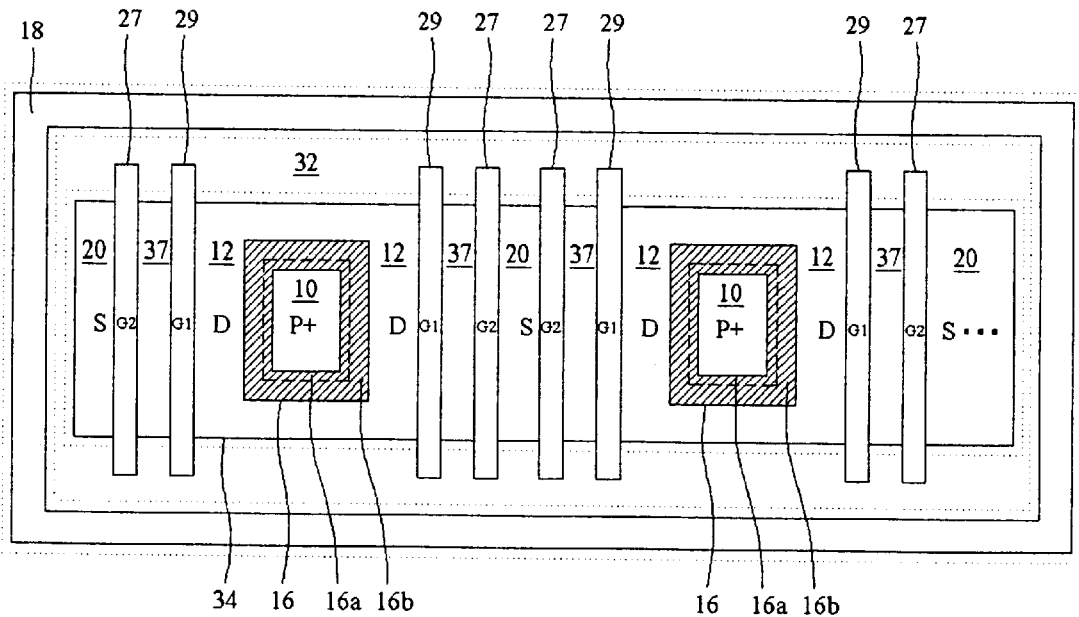
FIG. 11 is the top view of a layout of the stacked NMOSs of the present invention.

FIG. 11 shows the top view of a stacked NMOS fabricated in accordance with the present invention. The stacked NMOS is surrounded by a guard ring 18 isolated from an active region 34 by a field oxide layer 32. The stacked NMOS in FIG. 11 is a finger-type NMOS having a plurality of parallel gate structures 27 and 29, with every two gate structures 27 and 29 sharing a common (N+) source/drain region 37. Dummy gate structures 16 are formed in drain regions 12. P+ doped regions 10 used as substrate-triggering regions to provide triggering current are surrounded by the dummy gate structures 16. Regions 16a of the dummy gate structures 16 are doped with positive-type ions and regions 16b of the dummy gate structures 16 are doped with negative-type ions. The dummy gate structures 16 are fabricated in accordance with the minimum rule for shortening the distances between the P+ doped regions 10 and the bases of parasitic BJTs in the stacked NMOS and minimizing the layout area of the components. Similarly, a stacked PMOS implemented by dummy gate structures can be fabricated in accordance with the proposed configurations.

Figure 12:
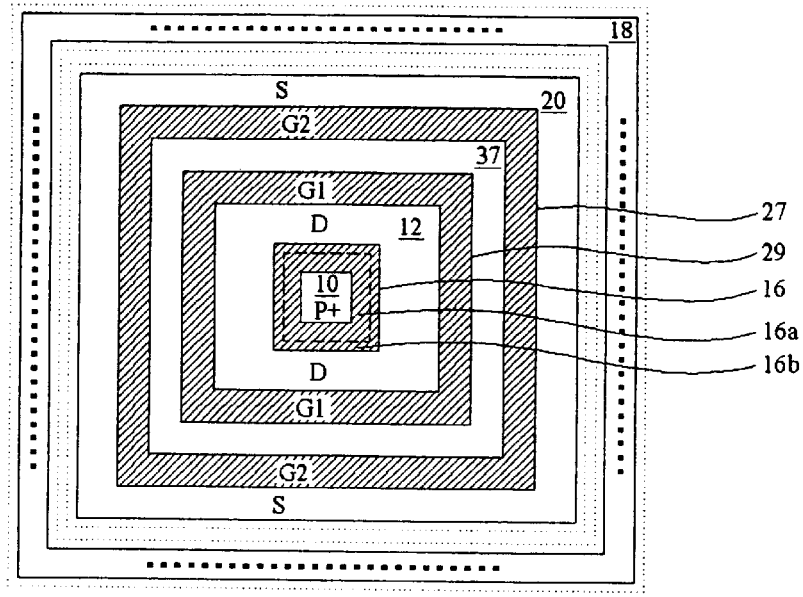
Figure 13:
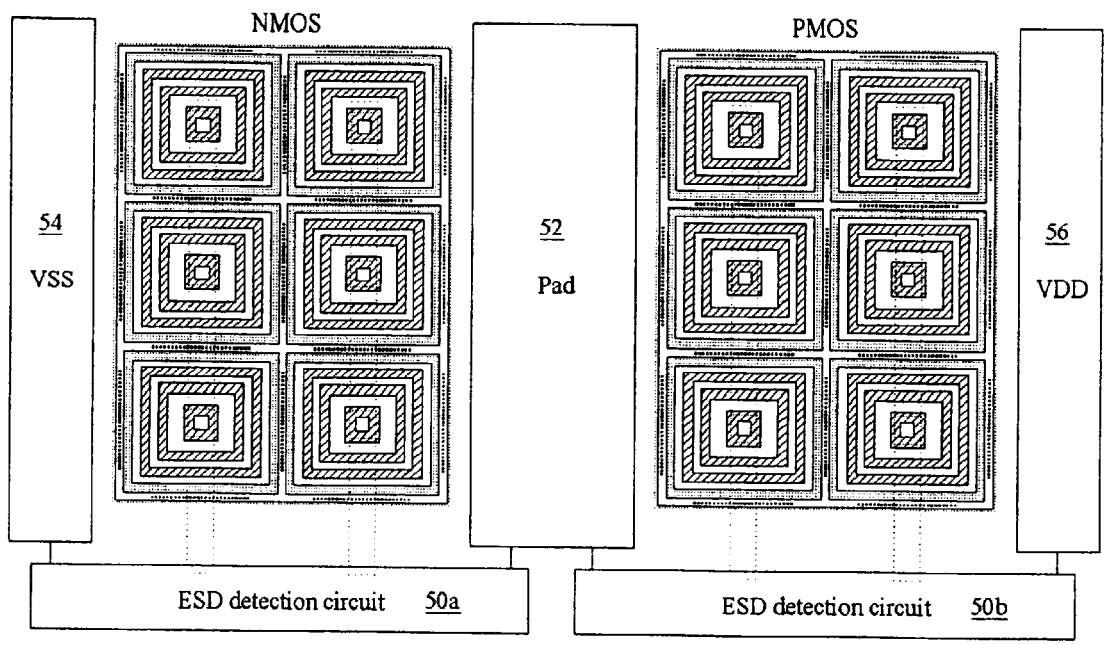
Figure 14:
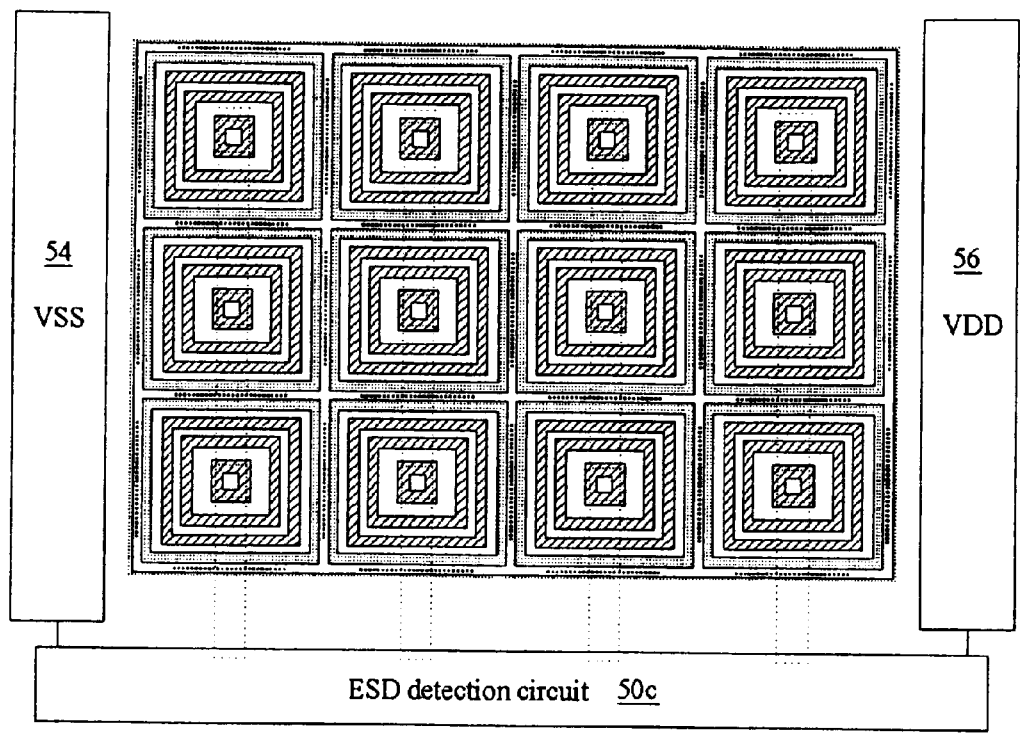

Stacked MOSFETs corresponding to the single MOSFETs in FIGS. 7 to 9 are shown in FIGS. 12 to 14. Operations of the embodiments in FIGS. 12 to 14 are similar to those described. Relevant descriptions are thus omitted.

In conventional techniques, substrate-triggering regions providing triggering current are surrounded by field-oxide layers. In comparison, the substrate-triggering regions in the ESD protection components fabricated in accordance with the present invention are surrounded by dummy gate structures. Dummy gate structures are generally narrower than field oxide layers. Therefore, substrate-triggering regions used to provide triggering current in ESD protection components of the present invention are closer to the bases of parasitic BJTs of the ESD protection components. Triggering speed during an ESD event and ESD robustness of the ESD protection components are thus enhanced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A substrate-triggered electrostatic discharge (ESD) protection component, suitable for application on a substrate, comprising:
    a first doped region of a first conductivity type and formed on the substrate;
    a bipolar junction transistor (BJT) comprising:
        an emitter and a collector respectively formed by a second doped region and a third doped region on the first doped region, both of a second conductivity type; and
    a base, formed by part of the first doped region between the second and the third doped regions;
    a substrate-triggering region, formed by a fourth doped region of the first conductivity type in the first doped region, to provide triggering current; and
    a dummy gate structure having a poly-silicon gate, formed adjacent to the third doped region, and surrounding the substrate-triggering region;
    wherein the emitter is coupled to a power line, the collector is coupled to a pad, and the substrate-triggering region is coupled to an ESD detection circuit; during normal circuit operations, the base couples with the power line through the ESD detection circuit; and during an ESD event, a triggering current is provided to the substrate-triggering region by the ESO detection circuit to trigger the BJT and release ESD current.

2. The substrate-triggered ESD protection component in claim 1, wherein the substrate is a semiconductor of the first conductivity type.

3. The substrate-triggered ESD protection component in claim 1, wherein the substrate is a semiconductor of the second conductivity type and the first doped region is a well on the substrate.

4. The substrate-triggered ESD protection component in claim 1, wherein the poly-silicon gate comprises a first region of the first conductivity type and adjacent to the substrate-triggering region, and a second region of the second conductivity type and adjacent to the third doped region.

5. The substrate-triggered ESD protection component in claim 1, wherein the ESD protection component further comprises a guard ring of the first conductivity type and formed on the first doped region enclosing the BJT, the substrate-triggering region, and the dummy gate structure.

6. The substrate-triggered ESD protection component in claim 1, wherein the collector and emitter are a drain region and a source region of a metal oxide semiconductor (MOS).

7. The substrate-triggered ESD protection component in claim 6, wherein the MOS has a gate structure formed on the first doped region, to separate the drain region from the source region and enclosing the dummy gate structure and the substrate-triggering region.

8. The substrate-triggered ESD protection component in claim 1, wherein the ESD protection component further comprises a stacked metal-oxide-semiconductor (MOS) transistor, comprising:
   a plurality of gate structures formed on the first doped region;
   at least one shared drain/source region, formed on the first doped region between the gate structures; and
   two independent drain/source regions formed on the first doped region and adjacent to two control gates of the gate structures, to become the collector and the emitter of the BJT.

9. The substrate-triggered ESD protection component in claim 8, wherein the dummy gate structure and the substrate-triggering region are surrounded by the gate structures.

10. The substrate-triggered ESD protection component in claim 1, wherein a well region of the second conductivity type is formed under the second doped region to increase spread resistance between the base and the power line.

11. An ESD protection circuit, suitable for application of an integrated circuit (IC), comprising:
   an ESD detection circuit, for detecting an ESD event and providing triggering current;
   a bipolar junction transistor (BJT), comprising:
      a base, formed by a first doped region of a first conductivity type, coupled to the ESD detection circuit through a substrate-triggering region; and
      a collector and an emitter, respectively formed by a second doped region and a third doped region, both of a second conductivity type and formed on the first doped region, the emitter coupled to a power line and the collector coupled to a pad; and
      a dummy gate structure, to separate the second doped region from the substrate-triggering region, and comprising a conductive gate, part of the conductive gate having dopant of the first conductivity type and the other part of the conductivity gate having dopant of the second conductivity type, wherein the substrate-triggering region is surrounded by the dummy gate structure;
   wherein during normal circuit operations, the base is coupled to the power line, and when an ESD event occurs at the pad, the BJT is triggered by the triggering current to release ESD current.

12. A structure of an ESD protection component, suitable for application on a substrate, comprising:
   a guard ring of a first conductivity type, formed on a first doped region of the first conductivity type on the substrate and coupled to a power line; and
   an active region, formed on the surface of the first doped region and surrounded by the guard ring, comprising:
      at least two gate structures formed approximately in parallel across the active region;
      at least one annular dummy gate structure, formed between the gate structures;
      at least a substrate-triggering region of the first conductivity type to provide triggering current, formed on the active region surrounded by the annular dummy gate structure and coupled to an ESD detection circuit;
      at least one source region of the second conductivity type, defined by the gate structures on the active region and coupled to the power line; and
      at least one drain region of the second conductivity type, defined by the gate structures and the annular dummy gate structure on the active region, and coupled to a pad;
   wherein during normal circuit operations, the first doped region is coupled to the power line through the guard ring; and, during an ESD event, triggering current is provided by the ESD detection circuit to trigger at least two bipolar-junction-transistors (BJTs) parasitic under the gate structures to release ESD stress.

13. The structure of an ESD protection component in claim 12, wherein the gate structures are used as a single gate of a metal-oxide-semiconductor field-effect-transistor (MOSFET).

14. The structure of an ESD protection component in claim 12, wherein the gate structures are a plurality of gates of a stacked MOSFET.

15. A structure of an ESD protection component, suitable for application on a substrate, comprising;
   a plurality of metal-oxide-semiconductor field-effect-transistor (MOSFET) cells arranged into a matrix, each MOSFET cell comprising:
      an annular dummy gate structure, formed on a first doped region of a first conductivity type on the substrate;
      a substrate-triggering region of the first conductivity type to provide triggering current, formed on the first doped region surrounded by the annular dummy gate structure and coupled to an ESD detection circuit;
      a drain region of a second conductivity type, formed on the first doped region surrounding the annular dummy gate structure and coupled to a pad;
      a gate structure, formed on the first doped region surrounding the drain region;
      a source region of the second conductivity type, formed on the first doped region surrounding the gate structure and coupled to a power line; and
      a guard ring of the first conductivity type, formed on the first doped region and coupled to the power line;
   wherein during normal circuit operations, the first doped region is coupled to the power line through the guard ring, and during an ESD event, triggering current is provided by the ESD detection circuit to trigger bipolar-junction-transistors (BJTs) parasitic under the gate structures to release ESD stress.

16. The structure of the ESD protection component in claim 15, wherein the gate structures of the MOSFET cells are coupled in parallel to become the gate of a single MOSFET.

17. The structure of the ESD protection component in claim 12, wherein each of the MOSFET cells has a plurality of gate structures coupled in series to become a stacked MOSFET having a plurality of gates.

* * * * *